United States Patent
Maltione et al.

(10) Patent No.: US 7,839,189 B2
(45) Date of Patent: Nov. 23, 2010

(54) VOLTAGE DETECTOR DEVICE AND METHODS THEREOF

(75) Inventors: Ricardo Maltione, Campinas (BR); Alfredo Olmos, Austin, TX (US); Eduardo Ribeiro Da Silva, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 54 days.

(21) Appl. No.: 12/339,938

(22) Filed: Dec. 19, 2008

(65) Prior Publication Data
US 2010/0156470 A1     Jun. 24, 2010

(51) Int. Cl.
*H03L 7/00* (2006.01)
(52) U.S. Cl. .......................... 327/143; 327/74
(58) Field of Classification Search ............. 327/74, 327/75, 76, 142, 143
See application file for complete search history.

(56) References Cited

U.S. PATENT DOCUMENTS

| | | | |
|---|---|---|---|
| 4,766,567 A | 8/1988 | Kato | |
| 5,619,165 A | 4/1997 | Fournel et al. | |
| 5,642,063 A * | 6/1997 | Lehikoinen | 327/74 |
| 5,903,767 A | 5/1999 | Little | |
| 5,920,182 A | 7/1999 | Migliavacca | |
| 6,559,629 B1 | 5/2003 | Fernald | |
| 6,873,193 B2 * | 3/2005 | Kinoshita et al. | 327/143 |

* cited by examiner

Primary Examiner—Jeffrey S Zweizig

(57) ABSTRACT

A voltage detector device is disclosed that includes a coarse-range voltage detector and a fine-range voltage detector. The fine-range voltage detector is configured to remain inactive, so that it consumes a relatively small amount of power, while a monitored voltage is outside a first specified range. In response to determining that the monitored voltage is within the first specified range, the coarse-range voltage detector activates the fine-range voltage detector so that it can monitor the voltage. In response to the fine-voltage monitor determining the voltage falls within a second specified range, the fine-range voltage detector provides a signal to a functional module of an electronic device so that the functional module can provide a defined response, such as executing an interrupt routine.

20 Claims, 4 Drawing Sheets

VOLTAGE DETECTOR DEVICE AND METHODS THEREOF

BACKGROUND

1. Field of the Disclosure

The present disclosure relates generally to electronic devices, and more particularly to electronic devices having voltage detector devices.

2. Description of the Related Art

Electronic devices frequently employ a voltage detector device to indicate if a particular voltage is outside a specified range. For example, battery operated devices often include a voltage detector to provide a low voltage indication when the voltage supplied by the battery has decreased below a predetermined level. The low voltage indication can notify the user of the device that the battery should be replaced or recharged. In some electronic devices, it is desirable that the voltage detector have a relatively fine resolution, so that the detector is able to determine when a monitored voltage is within a narrow range. However, such a voltage detector can consume an undesirable amount of power.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

A voltage detector device is disclosed that includes a coarse-range voltage detector and a fine-range voltage detector. The fine-range voltage detector is configured to remain inactive, so that it consumes a relatively small amount of power, while a monitored voltage is outside a first specified range. In response to determining that the monitored voltage is within the first specified range, the coarse-range voltage detector activates the fine-range voltage detector so that it can monitor the voltage. In response to the fine-voltage monitor determining the voltage falls within a second specified range, the fine-range voltage detector provides a signal to a functional module of an electronic device so that the functional module can provide a defined response, such as executing an interrupt routine. The fine-range voltage detector is associated with a finer detection range than the coarse-range voltage detector, but consumes relatively more power. Accordingly, by maintaining the fine-voltage detector in an inactive state until the monitored voltage is within the first specified range, power consumption of the voltage detector device is reduced while maintaining a relatively fine voltage detection resolution.

Figure 1:
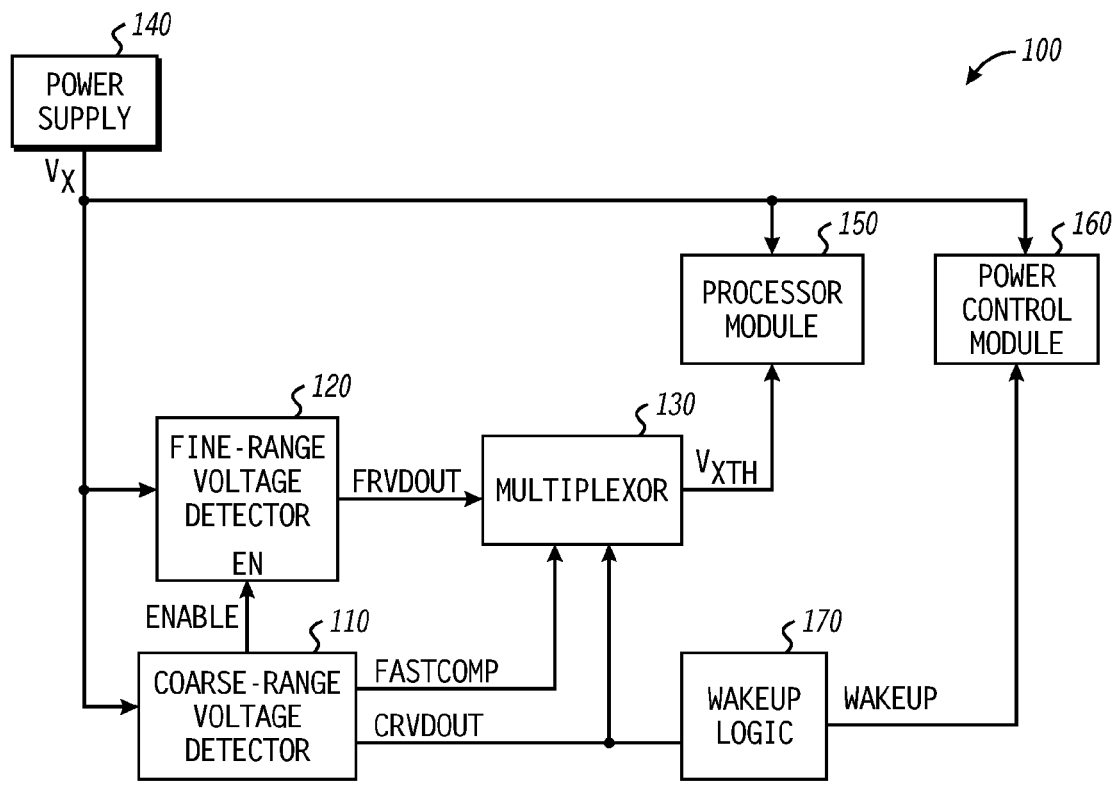
FIG. 1 illustrates an electronic device including a voltage detector in accordance with a specific embodiment of the present disclosure.

FIG. 1 illustrates an electronic device 100 including a voltage detector in accordance with a specific embodiment of the present disclosure. Electronic device 100 includes a coarse-range voltage detector 110, a fine-range voltage detector 120, a multiplexer 130, a power supply 140, a processor module 150, a power control module 160, and wakeup logic 170. Coarse-range voltage detector 110 and fine-range voltage detector 120, processor module 150, and power control module 160, are each connected to a node, labeled VX, which conducts a supply voltage provided by power supply 140. Coarse-range voltage detector 110 has an output to provide a signal labeled "ENABLE", to fine-range voltage detector 120, an output to provide a signal labeled "FASTCOMP", and an output to provide a control signal labeled "CRVDOUT." Wakeup logic 170 includes an input to receive the signal CRVDOUT and an output to provide a signal labeled "WAKEUP" to power control module 160. Fine-range voltage detector 120 includes an output to provide a signal labeled "FRVDOUT." Multiplexor 130 includes an input to receive the signal FRVDOUT, an input to receive the signal FASTCOMP, an input to receive the signal CRVDOUT, and an output to provide a signal labeled "VXTH" to processor module 150.

Power supply 140 supplies voltage signal VX for electronic device 100. Power supply 140 may be an electronic device, such as a voltage regulator, connected to an uninterrupted power source, a battery, and the like. In an embodiment, voltage signal VX can be subject to fluctuations or degradations over time. For example, if power supply 140 is a battery, the level of voltage signal VX will typically decrease over time as power is consumed by electronic device 100.

Coarse-range voltage detector 110 is configured to determine whether the level of voltage signal VX is within a specified range, e.g. within a specified window, referred to herein as the coarse detection range. The coarse detection range is bound by a high threshold voltage and a low threshold voltage. In response to the level of voltage signal VX being within the coarse detection range, coarse-range voltage detector 110 asserts signals ENABLE and WAKEUP. In addition, signal FASTCOMP is asserted if the level of voltage signal VX is greater than the low threshold voltage, and is negated if the level of voltage signal VX is less than the low threshold voltage.

Fine-range voltage detector 120 is configured to be placed in an inactive state or an active state, based on the state of the signal ENABLE. In the inactive state, fine-range voltage detector 120 consumes a relatively small amount of power and does not monitor voltage signal VX. In the active state, fine-range voltage detector 120 asserts a signal at its output in response to the level of voltage signal VX. For example, in one embodiment, fine-range voltage detector 120 includes a threshold comparator, which can detect when the level of voltage signal VX falls below or rises above a threshold voltage configured by a voltage reference. Fine-range voltage detector 120 can provide hysteresis around the threshold voltage such that as the level of voltage signal VX is falling, fine-range voltage detector 120 will not negate signal FRVDOUT until the level of voltage signal VX has fallen a has fallen a defined amount below the threshold voltage, where the defined amount can be fixed or configurable. If the level of voltage signal VX is rising, signal FRVDOUT is not asserted until the level of voltage signal VX has risen a defined amount above the threshold voltage, where the defined amount can be fixed or configurable.

In the active mode, the devices of fine-range voltage detector 120 use higher bias currents than the devices of coarse-range voltage detector 110. Accordingly, in the active mode, fine-range voltage detector 120 consumes relatively more power than coarse-range voltage detector 110. For the purpose of discussion, the coarse-range voltage detector is assumed to dissipate with approximately 10 nano-amperes of current, and the fine-range voltage detector is assumed to dissipate with approximately 10 micro-amperes of current.

Fine-range voltage detector 120 is configured to assert signal FRVDOUT when the level of voltage signal VX is substantially equal to a defined threshold voltage. Furthermore, fine-range voltage detector 120 is configured to prevent substantially short pulses or glitches, such as those that may be induced by power supply or electromagnetic noise from causing an assertion of signal FRVDOUT. For example, fine-range voltage detector 120 can include a resistor-capacitor (RC) filter or an active deglitch circuit to prevent short-duration pulses from appearing at output signal FRVDOUT. The deglitch circuit can be configured to provide a desired duration of glitch rejection by selecting an appropriate time constant.

Multiplexor 130 is configured to select one of the signals FRVDOUT and FASTCOMP based on the control signal CRVDOUT, and provide the selected signal as signal VXTH to processor module 150. The negation of signal VXTH provides processor module 150 with an indication of a low-voltage condition. If signal CRVDOUT is asserted, signal VXTH is based on signal FRVDOUT provided by fine-range voltage detector 120. If signal CRVDOUT is negated, signal VXTH is based on signal FASTCOMP provided by coarse-range voltage detector 110.

Processor module 150 is a functional module of the electronic device 100. As used herein, a functional module refers to an instruction based processor, state machine, combinatorial logic, and the like, and combinations thereof that are configured to perform one or more defined tasks for the electronic device 100. To illustrate, in response to assertion of the signal VXTH processor module 150 is configured to execute an interrupt handling routine. Processor module 150 thereby performs a defined function in response to the level of voltage signal VX being within the fine detection range. For example, electronic device 100 can respond to the negation of signal VXTH by performing an orderly power-down routine where information stored in volatile memory (not shown) is copied to non-volatile data storage (not shown). Processor module 150 can include interrupt service handling devices and software to manage and control the shutdown process. Thus, electronic device 100 can be turned off prior to experiencing damage or data loss resulting from a decrease in the level of voltage signal VX.

Figure 2:
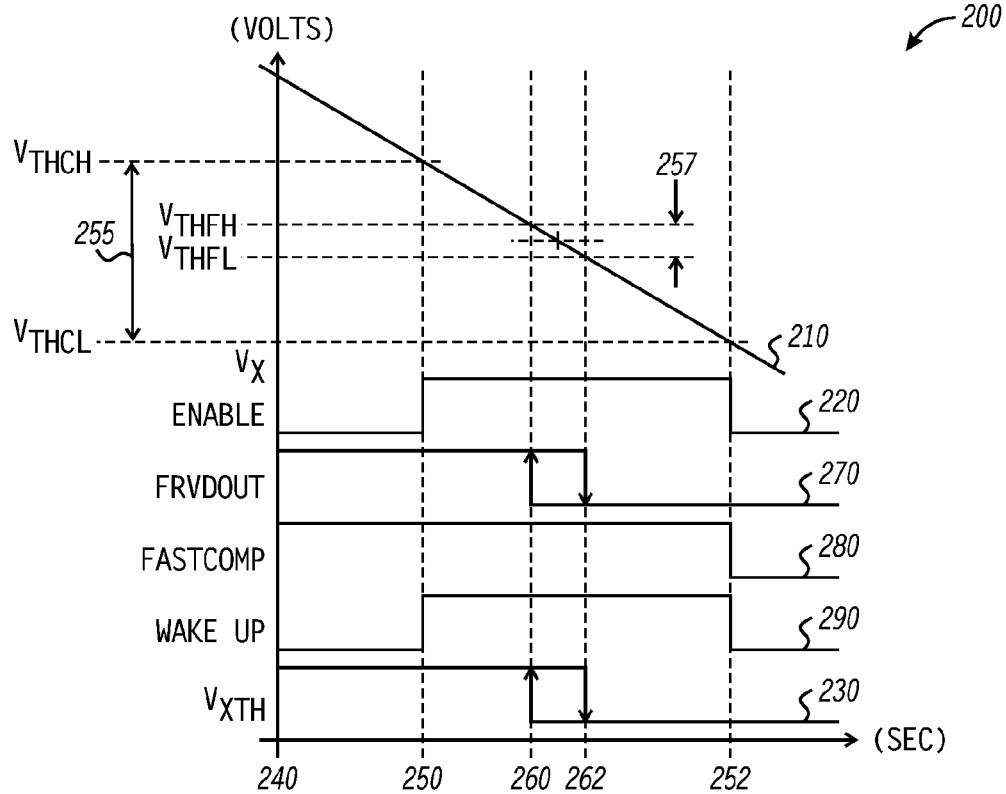
FIG. 2 includes a timing diagram illustrating the operation of the voltage detector of FIG. 1 in accordance with a specific embodiment of the present disclosure.

The operation of electronic device 100 can be better understood with reference to FIG. 2. In particular, FIG. 2 includes a timing diagram 200 illustrating the operation of the voltage detector of FIG. 1 in accordance with a specific embodiment of the present disclosure. The horizontal axis of timing diagram 200 represents time, in seconds, and the vertical axis represents voltage, in volts, with respect to each waveform. Timing diagram 200 includes signal VX waveform 210, signal ENABLE waveform 220, signal FRVDOUT waveform 270, signal FASTCOMP waveform 280, signal WAKEUP waveform 290, and signal VXTH waveform 230. Timing diagram 200 further includes time references 240, 250, 252, 260, and 262, voltages levels VTHCH, VTHCL, VTHFH, VTHFL, and voltage ranges 255 and 257.

Voltage signal VX is illustrated by waveform 210, and for this example, voltage signal VX is illustrated as decreasing in level over time. Coarse-range voltage detector 110 provides signal ENABLE illustrated by waveform 220, signal FASTCOMP illustrated by waveform 280, and signal WAKEUP illustrated by waveform 290. Fine-range voltage detector 120 provides signal FRVDOUT, illustrated by waveform 270. Signal ENABLE is configured to be active when the level of voltage signal VX is within voltage range 255, defined by reference voltages VTHCH and VTHCL. When the level of voltage signal VX is outside voltage range 255, such as at time reference 240, signal ENABLE is set to a logic-low value. Signal FASTCOMP is configured to be active when the level of voltage signal VX is greater than reference voltage VTHCL whereas signal WAKEUP will be active when the level of voltage signal VX is within voltage range 255.

At time reference 250, the level of voltage signal VX has fallen to a value VTHCH at which point coarse-range voltage detector 110 asserts signal ENABLE and signal WAKEUP, activating fine-range voltage detector 120. The level of voltage signal VX continues to decrease to a value of VTHFL at time reference 262, where signal VXTH is de-asserted in response to the de-assertion of signal FRVDOUT provided by fine-range voltage detector 120. Threshold VTHFL represents the minimum voltage at which processor module 150 properly operates. The range of detection provided by fine-range voltage detector 120 is illustrated as voltage range 257. Voltage range 257 is bounded by voltages VTHFH and VTHFL, and is typically configured to be smaller than voltage range 255 and included within voltage range 255.

In response to the level of voltage signal VX decreasing to or below a value of VTHCL at time reference 252, coarse-range voltage detector 110 negates signal ENABLE, signifying that the level of voltage signal VX is no longer within the coarse range for which coarse-range voltage detector 110 is configured. At this point, multiplexor 130 selects signal FASTCOMP to drive signal VXTH. If the level of voltage signal VX rises from a value less than VTHCL, signal ENABLE and signal WAKEUP will be asserted when the level of voltage signal VX has increased to VTHCL, once again activating fine-range voltage detector 120. If the level of voltage signal VX continues to rise, signal VXTH will be asserted at time reference 260 when the level of voltage signal VX has increased to a value of VTHFH, which is the threshold voltage VTHF of fine-range voltage detector 120 plus a configured hysteresis voltage amount. If the level of voltage signal VX increases above VTHCH, signal WAKEUP is negated. Thus, multiplexor 130 is configured to make signal VXTH responsive to signal FASTCOMP, and signal VXTH remains asserted.

For example, electronic device 100 can be operating normally, or can be in a sleep mode at time reference 240. Coarse-range voltage detector 110 is active and is monitoring voltage signal VX. When the level of voltage signal VX has fallen to within voltage range 255, coarse-range voltage detector 110 asserts signal ENABLE, which activates fine-range voltage detector 120. Coarse-range voltage detector 110 also asserts signal WAKEUP to alert electronic device 100, and power control module 160 in particular, that a low voltage situation may be imminent. Fine-range voltage detector 120 monitors the voltage signal VX and negates signal VXTH when the level of voltage signal VX has reached threshold voltage VTHFL, indicating to processor module 150 that a low-voltage condition has materialized so that processor module 150 can initiate appropriate action.

Figure 3:
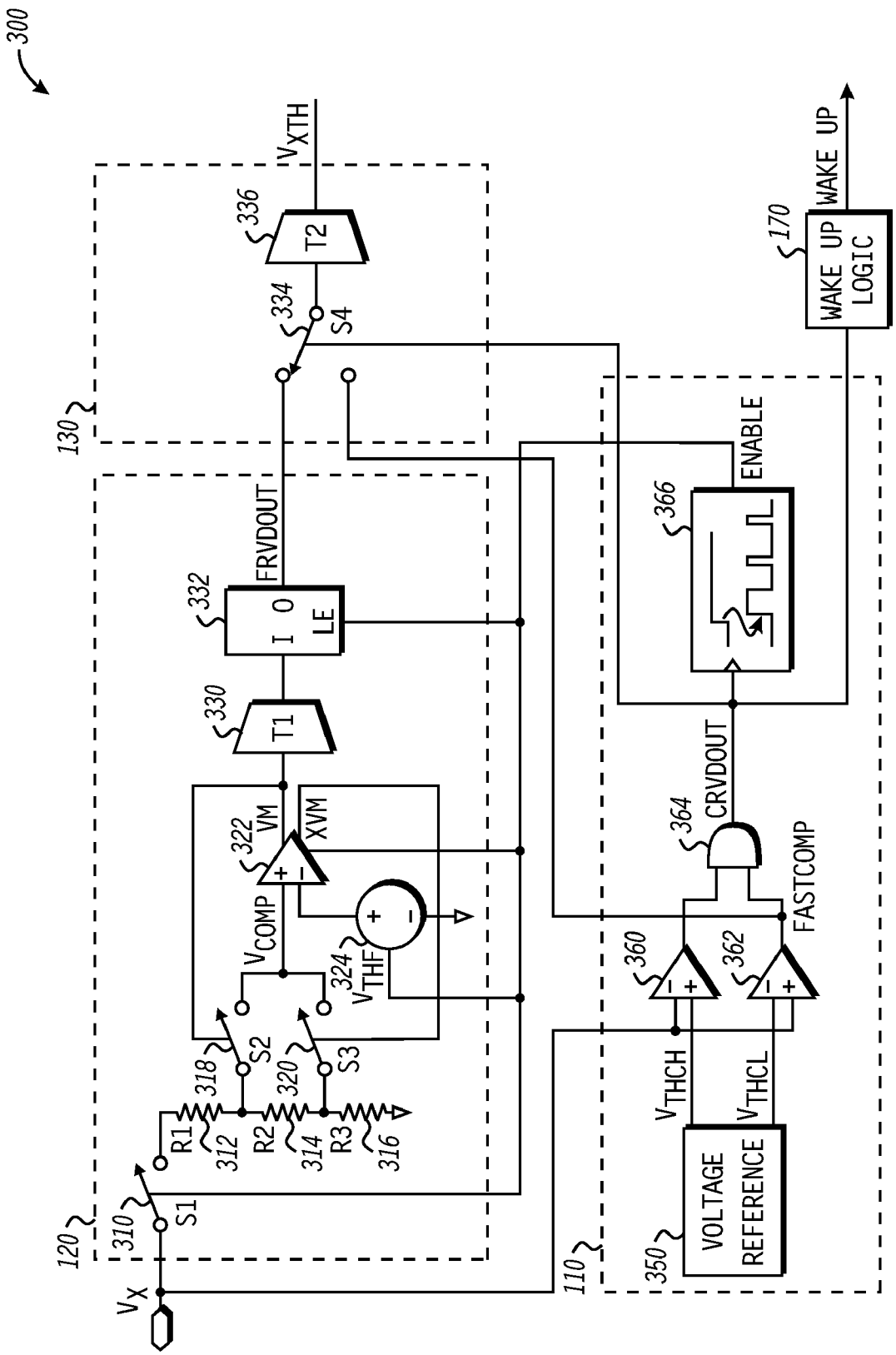
FIG. 3 illustrates in partial schematic and partial block diagram form the voltage detector of FIG. 1 in accordance with a specific embodiment of the present disclosure.

FIG. 3 illustrates in partial schematic and partial block diagram form a voltage detector 300 corresponding to the voltage detector 300 of FIG. 1 in accordance with a specific embodiment of the present disclosure. Voltage detector 300 includes a coarse-range voltage detector 110, a fine-range voltage detector 120, and a multiplexor 130. Coarse-range voltage detector 110 further includes a voltage reference 350, comparators 360 and 362, an AND gate 364, and an enable module 366. Fine-range voltage detector 120 further includes switches 310, 318, and 326, resistors 312, 314, and 316, a VTHF voltage reference 324, a comparator 322, a low pass filter 330, and a latch 332. Multiplexor 130 further includes a switch 334 and a low pass filter 336.

Voltage reference 350 has an output connected to the non-inverting input of comparator 360 to provide a reference voltage, labeled "VTHCH", and another output connected to the inverting input of comparator 362 to provide a reference voltage, labeled "VTHCL." The inverting input of comparator 360, and the non-inverting input of comparator 362 receive voltage signal VX. The output of comparator 362 provides a signal, labeled "FASTCOMP." Each of comparators 360 and 362 has an output that is connected to a corresponding input of AND gate 364. AND gate 364 has an output connected to an input of wakeup logic 170. Wakeup logic 170 includes an output to provide the signal, labeled "WAKEUP" to control switch 334 and enable module 366. Enable module 366 has an output to provide the signal, labeled "ENABLE", that controls switch 310 and voltage reference 324, and is received at an enable terminal of comparator 322, and at a latch enable input of latch 332.

Voltage signal VX is also connected to a first terminal of switch 310 labeled "S1". Resistor 312, labeled "R1", has a first terminal connected to the second terminal of switch 310, and a second terminal connected to a first terminal of resistor 314. Resistor 314, labeled "R2", has a first terminal connected to a second terminal of resistor 312, and a second terminal connected to a first terminal of resistor 316. Resistor 316, labeled "R3", has a first terminal connected to a second terminal of resistor 314, and a second terminal connected to ground. Switch 318, labeled "S2", has a first terminal connected to the first terminal of resistor 314, and a second terminal connected to a node labeled "VCOMP", Switch 320, labeled "S3", has a first terminal connected to a first terminal of resistor 316, and a second terminal also connected node "VCOMP". Comparator 322 has an non-inverting input also connected to node "VCOMP." Voltage reference 324, labeled "VTHF", has a positive voltage terminal connected to an-inverting input of comparator 322, and a negative voltage terminal connected to ground.

Comparator 322 has a non-inverting output connected to a node labeled "VM" that controls switch 318. Comparator 322 has an inverting output connected to a node, labeled "XVM" that controls switch 320. Low-pass filter 330, labeled "T1", has an input also connected to node VM and an output connected to the input of latch 332. Latch 332 has an output connected to a first input terminal of switch 334. Switch 334, labeled "S4", has a second input terminal connected to receive signal FASTCOMP, and an output terminal connected to the input of low-pas filter 336. Low-pass filter 336, labeled "T2", has an output to provide signal VXTH.

Voltage reference 350 of coarse-range voltage detector 110 is a switched-capacitor voltage divider that provides voltage references VTHCH and VTHCL to comparators 360 and 362. The output of comparator 360 is at a logic-high value when voltage signal VX is less than the value of voltage reference VTHCH, and the output of comparator 362 is at a logic-high value when voltage signal VX is greater than the value of voltage reference VTHCL. Therefore, the output of AND gate 364 is a logic-high value, and signal WAKEUP is asserted, when the level of voltage signal VX is less than voltage reference VTHCH and greater than voltage reference VTHCL. The operation of voltage reference 350 will be described in more detail with reference to FIG. 4.

In response to assertion of the signal CRVDOUT, enable module 366 asserts signal ENABLE. Signal ENABLE activates fine-range voltage detector 120 by closing switch 310, enabling VTHF voltage reference 324, enabling comparator 322, enabling latch 332, and configuring single-pole double-throw switch 334 such that the first input terminal of switch 334 is connected to the output terminal of switch 334. In this position, signal VXTH reflects the value of signal FRVD-OUT, which is the output of fine-range voltage detector 110. Prior to the assertion of signal ENABLE, signal VXTH reflects the state of signal FASTCOMP, which is the output of coarse-range voltage detector 110. Signal FASTCOMP is at a logic-high value unless the level of voltage signal VX is less than the value of voltage reference VTHCL.

In an embodiment, signal ENABLE can transition into a refresh mode of operation. The refresh mode is activated if the level of voltage signal VX remains within the detection range of course-range voltage detector 110 for a period greater than a predetermined amount of time. In this case, voltage signal VX may be decreasing at a slow rate and considerable time may elapse before further decreasing to the threshold voltage VTHF of fine-range voltage detector 120. While operating in the refresh mode, signal ENABLE is periodically asserted to activate fine-range voltage detector 120, and subsequently negated to temporarily deactivate fine-range voltage detector 120. For example, once the level of voltage signal VX has decreased below the value of voltage reference VTHCH, coarse-range voltage detector 110 asserts signal ENABLE, which activates fine-range voltage detector 120. If the level of voltage signal VX is dropping substantially quickly, fine-range voltage detector 120 may soon detect that the level of voltage signal VX has decreased to the threshold voltage value VTHFL, and signal VXTH is negated. However, if the level of voltage signal VX is dropping relatively slowly, fine-range voltage detector 120 can be deactivated and periodically awaken. Thus, the average power dissipation of fine-range voltage detector 120 can be reduced. As previously described, signal WAKEUP can provides an initial warning to electronic device 100, and to power control module 160 in particular, that a low voltage condition may be imminent. If the level of voltage signal VX decreases faster than fine-range voltage detector 120 is configured to respond, signal VXTH is negated in response to the negation of signal FASTCOMP provided by coarse-range voltage detector 110.

Fine-range voltage detector 120 includes voltage reference 324, the magnitude of which is VTHF. Resistor 312, 314, and 316, in association with switches 318 and 320, provide hysteresis when the level of voltage signal VX is rising and when the level of voltage signal VX is falling. The magnitude of the hysteresis value is specified by the equations:

$$\text{Vhysteresis} = VTHFH - VTHFL = \left(\frac{R1 + R2}{R3} - \frac{R1}{R2 + R3}\right)VTHF$$

where the rising and falling threshold voltages are, respectively:

$$VTHFH = \left(\frac{R_1 + R_2 + R_3}{R_3}\right)VTHF$$

$$VTHFL = \left(\frac{R_1 + R_2 + R_3}{R_2 + R_3}\right)VTHF$$

and R1, R2, and R3 are the resistance of resistors 312, 314, and 316, respectively, and VTHF is the voltage provided by voltage reference 324. Vhysteresis represents the difference between threshold voltages VTHFH and VTHFL. Thus, fine-range voltage detector 120 will negate signal VXTH when voltage signal VX has decreased below threshold voltage VTHFL, and will assert signal VXTH if the level of voltage signal VX increases above threshold voltage VTHFH.

Switch 318 is closed when node VM is at a logic-high value (node XVM is low), and open when node VM is at a logic-low value (node XVM is high). Switch 320 is closed when node VM is at a logic-low (node XVM is high), and open when node VM is high (node XVM is low). If the level of voltage signal VX is falling and below the value of voltage reference VTHCH (so that fine-range voltage detector 120 is activated) and above threshold voltage VTHFL, the output of comparator 322, node VM, will be at a logic-high value and switch 318 will be closed. As the level of voltage signal VX falls to a value equal to the threshold voltage VTHFL, comparator 322 will change states, and set node VM to a logic-low value. Switch 318 will open and switch 320 will close. Comparator 322 will not change states again unless the level of voltage signal VX rises above threshold voltage VTHFH.

When the level of voltage signal VX falls to a value that causes comparator 322 to switch states, comparator 322 is susceptible to substantially minute variations in the level of voltage signal VX and sources of electrical noise. Under these circumstances, comparator 322, and thus the signal at node VM, can glitch for a period of time before resolving to a stable state. These glitches are rejected by low-pass filter 330 of fine-range voltage detector 120. As previously mentioned, the time constant of low-pass filter 330 can be configured to meet specified operating parameters.

Latch 332 is enabled when fine-range voltage detector 120 is active, and the output of latch 332 will therefore reflect the signal present at node VM. Switch 334 is configured to provide this signal to low-pass filter 336, which performs additional noise rejection. Once signal conditioning and latching of the signal at node VM is complete, the state of fine-range voltage detector 120 is ultimately reflected at signal VXTH. Note, that signal VXTH transitions to a logic low value to indicate that the level of voltage signal VX has decreased below threshold voltage VTHFL. Low pass filter 336 prevents glitches that can be induced on signal FASTCOMP when the level of voltage signal VX is close to the value of voltage reference VTHCL, and multiplexor 130 is configured to select signal FASTCOMP.

Figure 4:
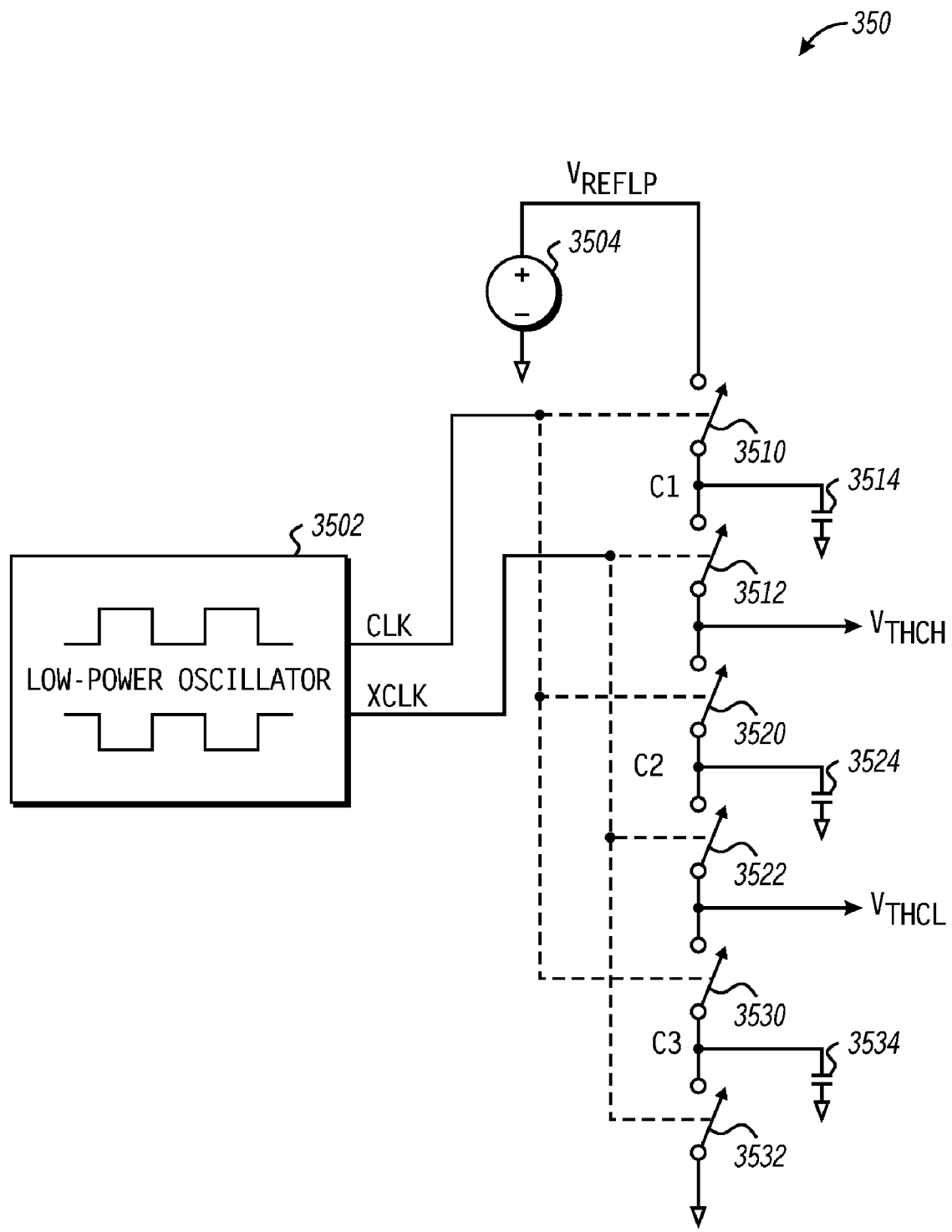
FIG. 4 illustrates in partial schematic and partial block diagram form the voltage reference of FIG. 3 in accordance with a specific embodiment of the present disclosure.

FIG. 4 illustrates in partial schematic and partial block diagram form the voltage reference 350 of FIG. 3 in accordance with a specific embodiment of the present disclosure. Voltage reference 350 includes oscillator 3502, voltage reference 3504, switches 3510, 3512, 3520, 3522, 3530, and 3532, and capacitors 3514, 3524, and 3534.

Voltage reference 3504 has a negative terminal and a positive terminal. The negative terminal is connected to ground, and the positive terminal is connected to node labeled "VREFLP." Switch 3510 has a first terminal connected to node VREFLP and a second terminal connected to a node labeled "15." Capacitor 3514 has a first terminal also connected to node 15 and a second terminal connected to ground. Switch 3512 has a first terminal also connected to node 15 and a second terminal connected to a node labeled "VTHCH." Switch 3520 has a first terminal connected to node VTHCH and a second terminal connected to a node labeled "C2." Capacitor 3524 has a first terminal also connected to node C2 and a second terminal connected to ground. Switch 3522 has a first terminal also connected to node C2 and a second terminal connected to a node labeled "VTHCL." Switch 3530 has a first terminal connected to node VTHCL and a second terminal connected to a node labeled "C3." Capacitor 3534 has a first terminal also connected to node C3 and a second terminal connected to ground. Switch 3532 has a first terminal also connected to node C3 and a second terminal connected to ground. Oscillator 3502 has a first output to provide a signal labeled "CLK", and a second output to provide a signal labeled "XCLK." Signals CLK and XCLK have an inverse relationship so that when one is at a logic-high value, the other will be at a logic-low value. Switches 3510, 3520 and 3530 are closed when signal CLK is at a logic-high value, and open when signal CLK is at a logic-low value. Switches 3512, 3522 and 3532 are closed when signal XCLK is at a logic-high value, and open when signal XCLK is at a logic-low value.

Coarse-range voltage detector 110 asserts signal WAKEUP when the level of voltage signal VX is between reference voltages VTHCH and VTHCL. Voltage reference 350 implements a voltage divider where reference voltages VTHCH and VTHCL are configured by the following equations:

$$VTHCH = VREFLP\left[\frac{SC2 + SC3}{SC1 + SC2 + SC3}\right]$$

$$VTHCL = VREFLP\left[\frac{SC3}{SC1 + SC2 + SC3}\right]$$

where $$SC1 = \left[\frac{1}{f_{osc}C1}\right],$$

$$SC2 = \left[\frac{1}{f_{osc}C2}\right],$$

and $$SC3 = \left[\frac{1}{f_{osc}C3}\right]$$

where VREFLP represents the voltage provided by voltage reference 3504, and 15, C2, and C3 represent the capacitance of capacitors 3514, 3524, and 3534, respectively, and $f_{osc}$ represents the frequency of a very low power oscillator. A switched-capacitor voltage divider, such as voltage reference 350, can be used instead of a typical resistor voltage divider, with some advantages. For example, capacitance values can be selected such that the effective resistance represented by each capacitor-switch element is substantially large. In one embodiment, the effective resistance of the switched-capacitor voltage divider can be on the order of giga-ohms. In another embodiment, signal VX can be applied to a switched-capacitor voltage divider to provide voltage references VTHCH and VTHCL.

Figure 5:
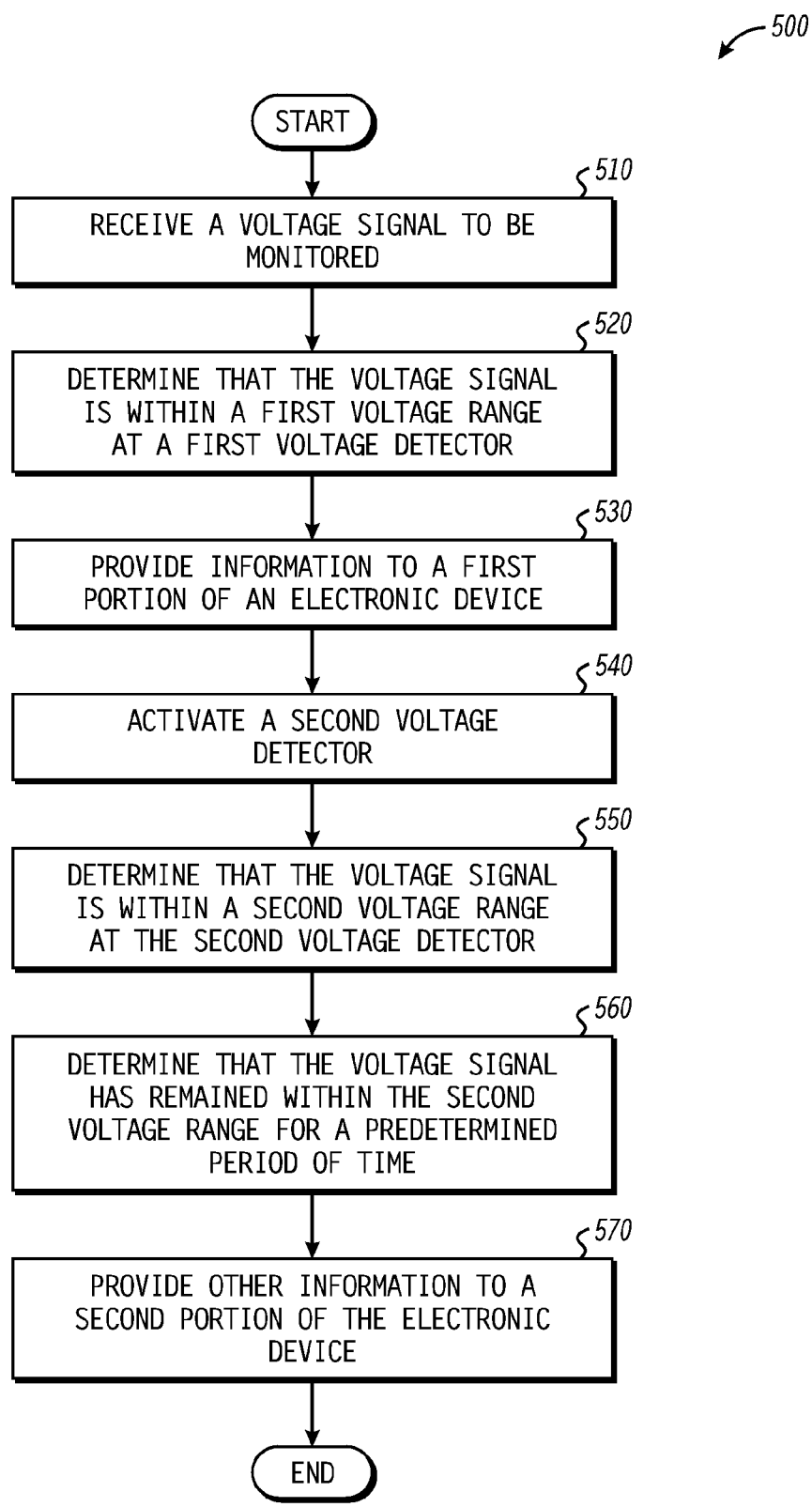
FIG. 5 includes a flow diagram illustrating a method in accordance with a specific embodiment of the present disclosure.

FIG. 5 includes a flow diagram 500 illustrating a method in accordance with a specific embodiment of the present disclosure. At block 510, a voltage signal to be monitored is received. For example, this voltage signal may represent the potential supplied by a power supply, such as a battery. At block 520, a first voltage detector determines that the voltage signal is within a first voltage range. At block 530, information is provided to a first portion of an electronic device. For example, the electronic device may be transitioned from a low power mode to an active mode, or alerted that a low-voltage condition may be imminent. At block 540, a second voltage detector is activated. At block 550, the second voltage detector determines that the voltage signal is within a second voltage range. In an embodiment, the second voltage range can be smaller and bounded by the first voltage range.

At block 560, it is determined that the voltage signal has remained within the second voltage range for a predetermined period of time, to reject spurious or erroneous operation, such as noise induced glitches. At block 570, other information is provided to a second portion of the electronic device. For example, critical data of electronic device 100 can be saved into non-volatile memory and the electronic device can be turned off before functionality is impaired due to insufficient operating voltage.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

For example, a switched-capacitor voltage divider is illustrated to provide voltage references VTHCH and VTHCL for coarse-range voltage detector 110, but other techniques such as a typical resistor divider can also be used. Fine-range voltage detector 120 provides detection hysteresis about a threshold voltage, but another type of voltage detector that can be activated by coarse-range voltage detector 110 can be substituted. A voltage detector may typically be used to detect a low-voltage condition, but the voltage detector disclosed herein is equally applicable for use in detecting an over-voltage situation at electronic device 100.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
in response to determining at a first voltage detector of an integrated circuit device that a voltage level of a first signal is within a first voltage range, detecting the voltage level of the first signal at a second voltage detector;
in response to detecting at the second voltage detector the voltage level of the first signal is within a second voltage range, communicating first information to a first functional module of the integrated circuit device; and
in response to determining at the first voltage detector device that the voltage level of the first signal is within the first voltage range, communicating second information to a second functional module of the integrated circuit device.

2. The method of claim 1, further comprising:
in response to determining at the first voltage detector device that the voltage level of the first signal is within the first voltage range, activating the second voltage detector to enable detection of the voltage level at the second voltage detector.

3. The method of claim 2, where activating the second voltage detector comprises operating the second voltage detector in a higher power mode than a non-activated state.

4. The method of claim 1, wherein the first voltage range is larger than the second voltage range.

5. The method of claim 1, wherein the first voltage range includes the second voltage range.

6. The method of claim 1, further comprising:
transitioning the integrated circuit device from a low-power mode to an active mode in response to communicating the second information.

7. The method of claim 1, wherein communicating the first information comprises communicating an interrupt signal to a processor device of the integrated circuit device.

8. The method of claim 1, wherein communicating the first information comprises communicating the first information in response to determining the first signal has been within the second voltage range for a predetermined period of time.

9. A method, comprising:
asserting a first signal at a first voltage detector in response to determining that a first voltage is within a first voltage range;
in response to assertion of the first signal, transitioning a second voltage detector to an active mode from an inactive mode; and
when the second voltage detector is an active mode, communicating an interrupt signal to a processor device in response to determining the first voltage is within a second voltage range.

10. The method of claim 9, wherein communicating the interrupt signal comprises communicating the interrupt signal in response to determining the first voltage has been within the second voltage range for a predetermined period of time.

11. The method of claim 9, wherein the first voltage is representative of a power supply voltage for an integrated circuit device.

12. The method of claim 9, further comprising transitioning a functional module of an integrated circuit device from a low-power mode to a normal mode in response to assertion of the first signal.

13. The method of claim 9, further comprising:
when the second voltage detector is in the active mode, transitioning the second voltage detector to a low-power mode in response to determining the first voltage is not within the first voltage range.

14. The method of claim 9, wherein the second voltage detector consumes more power when in the active mode than the first voltage detector when the second voltage detector is in the active mode.

15. A device, comprising:
a first voltage detector comprising:
a first input configured to receive a first signal; and
an output configured to assert a second signal in response to a voltage level of the first signal being within a first voltage range; and
a second voltage detector comprising:
a first input configured to receive the first signal;
a second input coupled to the output of the first voltage detector; and
an output configured to communicate an indication of an interrupt to a processor device in response to the voltage level of the first signal being within a second voltage range when the second voltage detector is in an active mode, the second voltage detector configured to be placed in the active mode in response to assertion of the second signal.

16. The device of claim 15, wherein the output of the second voltage detector is to communicate the interrupt signal in response to determining the first voltage has been within the second voltage range for a predetermined period of time.

17. The device of claim 15, wherein the second voltage detector is configured to transition from a low-power mode to the active mode in response to assertion of the second signal.

18. The device of claim 15, further comprising a functional module coupled to the output of the first voltage detector, wherein the functional module is configured to transition from a low-power mode to an active mode in response to assertion of the second signal.

19. The device of claim 15, wherein the first voltage detector further comprises:
   a first comparator comprising a first input configured to receive the first signal, a second input configured to receive a third signal representative a first reference voltage, and an output;
   a second comparator comprising a first input configured to receive the first signal, a second input configured to receive a fourth signal representative of a second reference voltage, and an output; and
   a logic gate comprising a first input coupled to the output of the first comparator, a second input coupled to the output of the second comparator, and an output coupled to the output of the first voltage detector.

20. The device of claim 19, wherein the second voltage detector comprises:
   a first resistive element comprising a first terminal coupled to the first input of the second voltage detector and a second terminal;
   a second resistive element comprising a first terminal coupled to the second terminal of the first resistive element;
   a first switch comprising a first terminal coupled to the second terminal of the first resistive element, a second terminal, and a control input;
   a second switch comprising a first terminal coupled to the second terminal of the second resistive element, a second terminal, and a control input; and
   a third comparator comprising a first input coupled to the second terminal of the first switch and the second terminal of the second switch, a second input configured to receive a fifth signal representative of a third reference voltage, a first output coupled to the output of the second voltage detector and coupled to the control input of the first switch and a second output coupled to the control input of the second switch.

* * * * *